(12) United States Patent
Sterna et al.

(10) Patent No.: US 10,250,158 B2
(45) Date of Patent: Apr. 2, 2019

(54) DIRECT CONVERSION SWITCHED-MODE AC/DC CONVERTER

(71) Applicant: Commissariat à l'Énergie Atomique et aux Énergies Alternatives, Paris (FR)

(72) Inventors: Léo Sterna, Grenoble (FR); Othman Ladhari, Echirolles (FR); Jean-Paul Ferrieux, Meylan (FR); David Frey, Grenoble (FR); Pierre-Olivier Jeannin, Grenoble (FR)

(73) Assignee: Commisariat à l'Énergie Atomique et aux Énergies Alternatives, Paris (FR)

( * ) Notice: Subject to any disclaimer, the term of this patent is extended or adjusted under 35 U.S.C. 154(b) by 0 days.

(21) Appl. No.: 15/866,392

(22) Filed: Jan. 9, 2018

(65) Prior Publication Data

US 2018/0198380 A1    Jul. 12, 2018

(30) Foreign Application Priority Data

Jan. 10, 2017    (FR) .................................... 17/50210

(51) Int. Cl.
*H02M 7/219*    (2006.01)
*H02M 7/155*    (2006.01)
(Continued)

(52) U.S. Cl.
CPC ......... *H02M 7/219* (2013.01); *H02M 1/4233* (2013.01); *H02M 1/4258* (2013.01);
(Continued)

(58) Field of Classification Search
CPC .. H02M 7/219; H02M 1/4233; H02M 1/4258; H02M 7/155; H02M 7/5388;
(Continued)

(56) References Cited

U.S. PATENT DOCUMENTS 5,406,051 A * 4/1995 Lai ...................... B23K 9/1056
                                                   219/130.1
5,926,381 A * 7/1999 Moriguchi .......... H02M 7/5387
                                                   363/132
(Continued)

FOREIGN PATENT DOCUMENTS

CN    101 882 927 B    7/2012

OTHER PUBLICATIONS

French Search Report for Application No. FR 17/50209 dated Sep. 27, 2017.
(Continued)

*Primary Examiner* — Emily P Pham
(74) *Attorney, Agent, or Firm* — Wolf, Greenfield & Sacks, P.C.

(57) ABSTRACT

An AC/DC conversion circuit, including: four bidirectional switches forming an H bridge; a capacitor connected between input nodes of the bridge; a capacitor connected between output nodes of the bridge; and a control circuit capable of controlling the bridge alternately to a first configuration where first and second diagonals of the bridge are respectively conductive and non-conductive, and to a second configuration where the first and second diagonals are respectively non-conductive and conductive, the control circuit being capable, during a phase of transition between the first and second configurations, of: turning off the switches of the first diagonal; and for each switch of the second diagonal, turning on the switch only when the voltage thereacross takes a zero value.

20 Claims, 4 Drawing Sheets

(51) Int. Cl.
    H02M 1/42      (2007.01)
    H03K 17/06     (2006.01)
    H03K 17/30     (2006.01)
    H02M 7/48      (2007.01)
    H02M 7/5388    (2007.01)
    H02M 1/00      (2006.01)
    H03K 17/74     (2006.01)

(52) U.S. Cl.
    CPC ......... *H02M 7/155* (2013.01); *H02M 7/4807* (2013.01); *H03K 17/06* (2013.01); *H03K 17/302* (2013.01); *H01L 2924/13091* (2013.01); *H02M 7/5388* (2013.01); *H02M 2001/0058* (2013.01); *H02M 2007/2195* (2013.01); *H03K 17/74* (2013.01)

(58) Field of Classification Search
    CPC .. H02M 2001/0058; H02M 2007/2195; H03K 17/06; H03K 17/302; H03K 17/74; H01L 2924/13091
    See application file for complete search history.

(56) References Cited

U.S. PATENT DOCUMENTS

| | | | | |
|---|---|---|---|---|
| 8,824,168 B2* | 9/2014 | Hua | ................. | H02M 3/33592 363/17 |
| 2005/0083714 A1* | 4/2005 | Zhu | ................. | H02M 3/28 363/17 |
| 2013/0051102 A1* | 2/2013 | Huang | ................. | H02M 7/217 363/127 |
| 2014/0268903 A1* | 9/2014 | Reiter | ................. | H02M 3/3376 363/21.02 |
| 2015/0280593 A1* | 10/2015 | Ando | ................. | H02M 1/42 363/17 |
| 2017/0005565 A1* | 1/2017 | Bai | ................. | H02M 3/33507 |

OTHER PUBLICATIONS

French Search Report for Application No. FR 17/50210 dated Sep. 28, 2017.

Guo et al., Operation Principles of Bidirectional Isolated AC/DC Converter with Natural Clamping Soft Switching Scheme. IEEE. Oct. 29, 2014;4866-72.

Keyhani et al., An Isolated Resonant AC-Link Three-Phase AC-AC Converter Using a Single HF Transformer. IEEE Transactions on Industrial Electronics. Oct. 2014;61(10):5174-83.

Norrga, A Soft-switched Bi-directional Isolated AC/DC Converter for AC-FED Railway Propulsion Applications. Power Electronics, Machines, and Drives. Apr. 16-18, 2002;487:433-8.

Pecelj et al., Three-Phase Active Bridge Inverter—3PAB. IEEE International Conference on Power Electronics, Drives, and Energy Systems (PEDES). Dec. 16, 2014. pp. 1-6.

* cited by examiner

DIRECT CONVERSION SWITCHED-MODE AC/DC CONVERTER

This application claims the priority benefit of French patent application number 17/50210, the content of which is hereby incorporated by reference in its entirety to the maximum extent allowable by law.

BACKGROUND

The present disclosure relates to power converters, and more particularly aims at an AC/DC converter, that is, a converter capable of converting an AC voltage into a DC voltage.

DISCUSSION OF THE RELATED ART

An AC/DC converter conventionally comprises a stage for rectifying the AC voltage applied at its input, comprising one or a plurality of diodes, followed by a stage of low-pass filtering of the rectified AC voltage delivered by the rectifying stage, followed by a stage of DC/DC conversion of the DC voltage delivered by the low-pass filtering stage, typically a switched-mode conversion stage comprising one or a plurality of controlled switches and an isolation transformer.

A disadvantage of converters of this type lies in their relatively high cost and bulk, resulting from the high number of components that they comprise and from the size of these components.

In particular, the low-pass filtering stage conventionally comprises a large capacitor, typically, a capacitor of several tens of microfarads and of several hundreds of volts for a converter intended to receive on its AC input a 220-V AC voltage, for example, the mains voltage.

Further, to limit switching losses in the DC/DC conversion stage, the operating frequency of the conversion stage (or cut-off frequency) is generally limited to a few hundreds of kHz, which limits possibilities of miniaturizing the DC/DC conversion stage, and in particular the isolation transformer.

Another disadvantage of converters of this type is that the presence of the rectifying stage comprising diodes significantly limits the converter efficiency.

Further, in certain applications where the converter is used to power an active DC load, for example, a battery, there is a need for a reversible converter, that is, capable not only of converting the AC input voltage into a DC output voltage to power the load (typically to charge a battery from an AC voltage), but also of converting a DC voltage delivered by the load into an AC voltage supplied on the AC input terminals of the converter (typically to inject back electric power drawn from the battery onto the AC network). Due to their architecture, and particularly due to the presence of the rectifying stage comprising diodes and of the low-pass filtering stage, converters of the type described hereabove do not provide such a reversibility.

U.S. Pat. No. 6,424,548 describes a so-called direct conversion switched-mode AC/DC converter, that is, which comprises no rectifying stage comprising diodes and no low-pass filtering stage upstream of the switched-mode conversion stage. More particularly, this converter comprises four bidirectional switches forming a first controlled H bridge, followed by an isolation transformer comprising a primary winding and a secondary winding, magnetically coupled, followed by four nearly bidirectional switches forming a second controlled H bridge. The input of the first H bridge directly receives the AC voltage to be converted, the primary winding of the transformer is connected between the output terminals of the first H bridge, the secondary winding of the transformer is connected between the input terminals of the second H bridge, and the DC load to be powered is connected between the output terminals of the second H bridge.

An advantage of this converter is that it comprises no rectifying stage comprising diodes and no low-pass filtering stage upstream of the switched-mode conversion stage, which enables to decrease the cost and the bulk and to improve the efficiency as compared with conventional solutions. Further, this converter is reversible.

However, as in conventional converters, switching losses in the switched-mode conversion stage in practice prevent the increase of the switching frequency of the switches beyond a few hundreds of kHz, which limits possibilities of miniaturizing the system, and in particular the isolation transformer.

It would be desirable to have an AC/DC converter overcoming all or part of the above-mentioned disadvantages of existing converters.

SUMMARY

Thus, an embodiment provides an AC-voltage-to-DC-voltage conversion circuit, comprising:

four first bidirectional switches forming a first H bridge, first and second input nodes of the bridge being respectively directly coupled to first and second nodes of application of the AC voltage:

a first capacitor connected in parallel with the first bridge between the first and second input nodes of the bridge;

a second capacitor connected in parallel with the first bridge between first and second output nodes of the bridge; and a control circuit capable of controlling the bridge alternately to a first configuration where the switches of a first diagonal of the bridge are on and the switches of a second diagonal of the bridge are off, and to a second configuration where the switches of the first diagonal are off and the switches of the second diagonal are on, the control circuit being capable, during a phase of transition between the first and second configurations, of successively:

turning off the switches of the first diagonal; and for each switch of the second diagonal, turning on the switch only when the voltage thereacross takes a zero value.

According to an embodiment, the conversion circuit further comprises four additional capacitors respectively connected across the four first switches.

According to an embodiment, the conversion circuit further comprises a transformer comprising a primary winding and a secondary winding, magnetically coupled, first and second ends of the primary winding being respectively coupled to first and second output nodes of the first bridge.

According to an embodiment, the conversion circuit further comprises four second switches forming a second H bridge, first and second input nodes of the second bridge being respectively coupled to first and second ends of the secondary winding of the transformer, and first and second output nodes of the second bridge being respectively coupled to first and second DC voltage supply nodes.

According to an embodiment, the control circuit is capable of controlling the second bridge alternately to a first configuration where the switches of a first diagonal of the bridge are on and the switches of a second diagonal of the bridge are off, and to a second configuration where the switches of the first diagonal are off and the switches of the second diagonal are on.

According to an embodiment, the control circuit is configured to switch the first bridge between its first and second configurations and to switch the second bridge between its first and second configurations substantially at the same frequency.

According to an embodiment, the control circuit is configured to switch the first bridge between its first and second configurations at a frequency greater than or equal to 1 MHz.

According to an embodiment, the control circuit comprises, for each first switch:

a first circuit capable of detecting that the voltage across the switch has taken a zero value and of supplying a logic output signal corresponding to the result of this detection;

a second circuit capable of performing a logic operation between the signal supplied by the first circuit and an external switch control signal, and of supplying a logic switch control signal corresponding to the result of this operation; and a third circuit capable of adapting the level of the signal supplied by the second circuit to accordingly control the switch.

According to an embodiment, each first switch is equivalent to an anti-series association of first and second MOS transistors connected by their sources, the drains of the first and second transistors respectively forming the conduction nodes of the switch, and the gates of the first and second MOS transistors being connected to a same switch control node.

According to an embodiment, the first circuit comprises a voltage comparator, a first voltage dividing bridge coupled between the drain and source nodes of the first transistor and having an output node coupled to a positive input node of the comparator, and a second voltage dividing bridge coupled between the drain and source nodes of the second coupled and having an output node coupled to a negative input node of the comparator.

According to an embodiment, the first switches are gallium nitride switches.

Another embodiment provides AC-voltage-to-DC-voltage conversion circuit, comprising:

four first bidirectional switches forming a first H bridge, first and second input nodes of the bridge being respectively coupled to first and second nodes of application of the AC voltage;

a transformer comprising a primary winding and a secondary winding, magnetically coupled, first and second ends of the primary winding being respectively coupled to first and second output nodes of the first bridge;

a first inductance series-connected with the first bridge between the first input node of the bridge and the first node of application of the AC voltage;

a second inductance series-connected with the first bridge, between the first output node of the bridge and the first end of the primary winding; and a control circuit capable of controlling the first bridge alternately to a first configuration where the switches of a first diagonal of the bridge are on and the switches of a second diagonal of the bridge are off, and to a second configuration where the switches of the first diagonal are off and the switches of the second diagonal are on, the control circuit being capable, during a phase of transition between the first and second configurations, of successively:

turning on a first switch of the second diagonal;

turning off a first switch of the first diagonal when the current flowing through this switch takes a zero value;

turning on the second switch of the second diagonal; and turning off the second switch of the first diagonal when the current flowing through this switch takes a zero value.

According to an embodiment, the conversion circuit further comprises four second switches forming a second H bridge, first and second input nodes of the second bridge being respectively coupled to first and second ends of the secondary winding of the transformer, and first and second output nodes of the second bridge being respectively coupled to first and second DC voltage supply nodes.

According to an embodiment, the control circuit is capable of controlling the second bridge alternately to a first configuration where the switches of a first diagonal of the bridge are on and the switches of a second diagonal of the bridge are off, and to a second configuration where the switches of the first diagonal are off and the switches of the second diagonal are on.

According to an embodiment, the control circuit is configured to switch the first bridge between its first and second configurations and to switch the second bridge between its first and second configurations substantially at the same frequency.

According to an embodiment, the control circuit is configured to switch the first bridge between its first and second configurations at a frequency greater than or equal to 1 MHz.

According to an embodiment, each first switch is capable of being controlled to the on state by the control circuit and to automatically turn off when the current flowing therethrough takes a zero value.

According to an embodiment, each first switch is equivalent to an anti-series association of first and second MOS transistors connected by their drains, the sources of the first and second transistors respectively forming the conduction nodes of the switch, and the gates of the first and second MOS transistors forming first and second switch control nodes.

According to an embodiment, the control circuit is configured to, when it controls a switch of the first bridge to the on state, apply a turn-on control signal to the gate of one of the first and second transistors of the switch and maintain a blocking signal on the gate of the other transistor.

According to an embodiment, the control circuit is configured to, when it controls a switch of the first bridge to the on state, apply a turn-on control signal to the gate of the first transistor and a blocking signal to the gate of the second transistor when the current to be conducted by the switch has a first biasing, and apply a turn-on control signal to the gate of the second transistor and a blocking signal to the gate of the first transistor when the current to be conducted by the switch has a second biasing opposite to the first biasing.

According to an embodiment, the first switches are gallium nitride switches.

The foregoing and other features and advantages will be discussed in detail in the following non-limiting description of specific embodiments in connection with the accompanying drawings.

DETAILED DESCRIPTION

The same elements have been designated with the same reference numerals in the various drawings and, further, the various drawings are not to scale. For clarity, only those steps and elements which are useful to the understanding of the described embodiments have been shown and are detailed. In particular, the applications which may be made of the described AC/DC converters have not been detailed, the described embodiments being compatible with usual AC/DC converter applications. Further, the switch control circuits of the described converters are only partially detailed, the total forming of such control circuits being within the abilities of those skilled in the art based on the indications of the present description. Unless otherwise specified, expressions "approximately", "substantially", and "in the order of" mean to within 10%, preferably to within 5%. Further, term "connected" is used to designate a direct electric connection, with no intermediate electronic component, for example, by means of one or a plurality of conductive tracks or conductive wires, and term "coupled" or term "linked" is used to designate an electric connection which may be direct (then meaning "connected") or indirect (that is, via one or a plurality of intermediate components).

First Embodiment—Capacitive Structure

Figure 1:
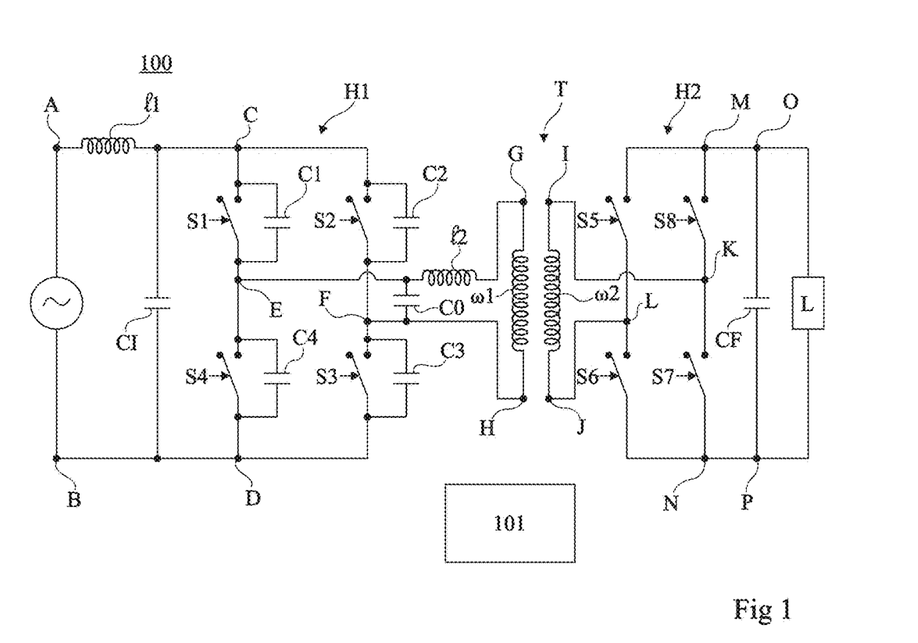
FIG. 1 is a wiring diagram of an example of an AC/DC converter according to a first embodiment.

FIG. 1 is a wiring diagram of an example of an AC/DC converter 100 according to a first embodiment.

Converter 100 comprises a first controlled H bridge H1, or primary bridge, followed by an isolation transformer T, followed by a second controlled H bridge H2, or secondary bridge.

Bridge H1 is formed of four switches, bidirectional in terms of current and of voltage, S1, S2, S3, and S4, for example, identical (to within manufacturing dispersions), each comprising two main conduction nodes and at least one control node. Switches S1 and S4 are series-coupled, by their conduction nodes, between input nodes C and D of the bridge. Switches S2 and S3 are series-coupled, by their conduction nodes, between nodes C and D, in parallel with the branch comprising switches S1 and S4. Junction point E of switches S1 and S4 defines a first output node of the bridge, and junction point F of switches S2 and S3 defines a second output node of the bridge. More particularly, in the shown example, switch S1 has a first conduction node connected to node C and a second conduction node connected to node E, switch S4 has a first conduction node connected to node E and a second conduction node connected to node D, switch S2 has a first conduction node connected to node C and a second conduction node connected to node F, and switch S3 has a first conduction node connected to node F and a second conduction node connected to node D.

Input nodes C and D of bridge H1 are directly coupled, that is, with no intermediate rectifying stage comprising diodes and no low-pass filtering stage, to nodes A and B of application of the AC input voltage of the converter. Low-pass filtering stage here means a low-pass filtering stage having a cut-off frequency approximately equal to or smaller than the frequency of the AC input voltage of the converter. Low-pass filtering elements with a higher cut-off frequency may however be provided, particularly to filter possible parasitic signals generated during the switching of the switches of bridge H1. More particularly, in this example, node C is coupled to node A via an inductance 11, and node D is connected to node B. Inductance 11 has the function of filtering possible parasitic voltage peaks generated during the switching of the switches of bridge H1. In the shown example, inductance 11 has a first end connected to node A and a second end connected to node C. As a variation, inductance 11 may be omitted, node C then being connected to node A.

According to an aspect of the first embodiment, primary bridge H1 is purely capacitive at its input and at its output. More particularly, converter 100 comprises a capacitor CI having its electrodes respectively connected to input nodes C and D of bridge H1, and a capacitor CO having its electrodes respectively connected to output nodes E and F of bridge H1. It should be noted that such a layout is unusual. Indeed, in power electronics, passive electric power exchange elements of different natures are generally provided at the input and at the output of a same H bridge, to respect source association rules.

In this example, converter 100 further comprises four capacitors C1, C2, C3, C4, for example, identical (to within manufacturing dispersions), respectively coupled in parallel with switches S1, S2, S3, S4 of bridge H1. More particularly, each capacitor Ci, i being an integer in the range from 1 to 4, has its electrodes respectively connected to the conduction nodes of the switch Si having the same index i.

As a variation, capacitor CO may be omitted, the output capacitance of bridge H1 being then distributed across switches S1, S2, S3, and S4, that is, distributed between capacitors C1, C2, C3, and C4.

Transformer T comprises a primary winding W1 and a secondary winding W2, magnetically coupled.

Ends G and H of primary winding W1 are respectively coupled to output nodes E and F of bridge H1. More particularly, in the shown example, end G of primary winding W1 is coupled to node E via an inductance 12, and end H of primary winding W1 is connected to node F. Inductance 12 has the function of filtering possible parasitic voltage peaks. In the shown example, inductance 12 has a first end connected to node G and a second end connected to node E. As a variation, inductance 12 may be omitted, node G then being connected to node E.

Bridge H2 is formed of four controlled switches S5, S6, S7, and S8, for example, identical (to within manufacturing dispersions), each comprising two main conduction nodes and at least one control node. Switches S5, S6, S7, and S8 are for example nearly bidirectional switches, that is, switches capable of conducting current in both directions, but only enabling to control the current in one direction, that is, which can only be controlled to the off state when a voltage having a determined biasing is applied between their conduction nodes (in other words, switches which are bidirectional in terms of current but unidirectional in terms of voltage). As a variation, switches S5, S6, S7, S8 are bidirectional in terms of current and of voltage. Switches S5 and S8 are series-coupled, by their conduction nodes, between input nodes K and L of the bridge. Switches S6 and S7 are series-coupled, by their conduction nodes, between nodes K and L, in parallel with the branch comprising switches S5 and S8. Junction point M of switches S5 and S8 defines a first output node of the bridge, and junction point N of switches S6 and S7 defines a second output node of the bridge. More particularly, in the shown example, switch S5 has a first conduction node connected to node L and a second conduction node connected to node M, switch S8 has a first conduction node connected to node M and a second conduction node connected to node K, switch S6 has a first conduction node connected to node L and a second conduction node connected to node N, and switch S7 has a first conduction node connected to node N and a second conduction node connected to node K.

Input nodes K and L of bridge H2 are respectively coupled to ends I and J of secondary winding W2 of transformer T. In the shown example, end I of winding W2 is connected to node K and end J of winding W2 is connected to node L.

Converter 100 further comprises an output filtering capacitor CF, at the output of bridge H2. In the shown example, the electrodes of capacitor CF are respectively connected to output nodes M and N of bridge H2.

Output nodes M and N of bridge H2 are respectively coupled to nodes O and P supplying the DC output voltage of converter 100. In the shown example, node M is connected to node O and node N is connected to P.

Converter 100 further comprises a circuit 101 (not detailed) for controlling switches S1, S2, S3, S4, S5, S6, S7 and S8 of bridges H1 and H2.

In operation, a load L to be powered, for example, an electric battery, may be connected between output nodes O and P of the converter.

Converter 100 operates as follows: Circuit 101 controls primary bridge H1 alternately to a first configuration where switches S1 and S3, defining a first diagonal of the bridge, are on and switches S2 and S4, defining a second diagonal of the bridge, are off, and to a second configuration where switches S1 and S3 are off and switches S2 and S4 are on. The frequency of the switching of bridge H1 between the first and second configurations, called cut-off frequency, is preferably selected to be much higher than the frequency of the AC voltage to be converted, for example, in the range from 200 kHz to 20 MHz for an input frequency in the range from 20 to 100 Hz. Duty cycle φH1 of the switching between the first and second configurations of bridge H1 is for example approximately equal to 0.5.

Circuit 101 further controls secondary bridge H2 alternately to a first configuration where switches S5 and S7, defining a first diagonal of the bridge, are on and switches S6 and S8, defining a second diagonal of the bridge, are off, and to a second configuration where switches S5 and S7 are off and switches S6 and S8 are on. The frequency of the switching of bridge H2 between the first and second configurations is substantially equal to the switching frequency of bridge H1. On switching from the first configuration to the second configuration, circuit 101 may further control bridge H2 to a first intermediate configuration where switches S5 and S8 are on and switches S6 and S7 are off. Further, on switching from the second configuration to the first configuration, circuit 101 may control bridge H2 to a second intermediate configuration where switches S5 and S8 are off and switches S6 and S7 are on.

Duty cycle φH2 of the switching between the first and second configurations of bridge H2 may however be different from duty cycle φH1 of the primary bridge. Further, a phase shift δH1H2 may be provided between the control sequence of primary bridge H1 and the control sequence of secondary bridge H2.

By varying parameters φH2 and δH1H2, circuit 101 regulates the DC output voltage of converter 100, and/or the current sampled from the source of AC converter power supply voltage, for example, to ensure a sinusoidal absorption of the current supplied by the AC source.

Further, the converter of FIG. 1 is reversible. Thus, in the case where an active load L, for example, a battery, is connected to the converter output, circuit 101 may, by varying the above-mentioned parameters φH1, φH2 and/or δH1H2, control a DC/AC electric power transfer from DC load L to the AC input of the converter.

According to an aspect of the first embodiment, control circuit 101 is configured to, during phases of transition between the first configuration (diagonal S1, S3 conductive and diagonal S2, S4 non-conductive) and the second configuration (diagonal S1, S3 non-conductive and diagonal S2, S4 conductive) of primary bridge H1, only turn on switches S2 and S4 when the voltage thereacross takes a value zero and, during phases of transition between the second configuration (diagonal S1, S3 non-conductive and diagonal S2, S4 conductive) and the first configuration (diagonal S1, S3 conductive and diagonal S2, S4 non-conductive) of bridge H1, only turn on switches S1 and S3 when the voltage thereacross takes a zero value.

This enables to significantly limit switching losses in primary bridge H1. The cut-off frequency of the converter may then be selected to be relatively high, for example, greater than 1 MHz or even greater than 10 MHz, which enables to significantly decrease the dimensions of isolation transformer T.

In a preferred embodiment, switches S1, S2, S3, S4 of the primary bridge H1 and switches S5, S6, S7, S8 of secondary bridge H2 are gallium nitride switches, for example, switches of the type described in patent application EP2736078 previously filed by the applicant, or in the article entitled "The single reference Bi-Directional GaN HEMT AC switch" by D. Bergogne et al. (Power Electronics and Applications (EPE'15 ECCE-Europe). Gallium nitride switches are indeed capable of operating at high switching frequencies with no risk of damage. The described embodiments are however not limited to this specific example.

Figure 2:
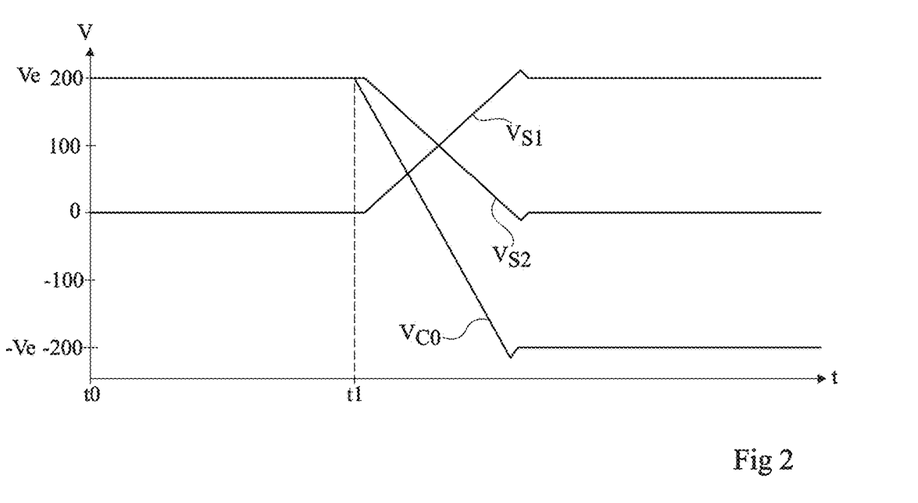
FIG. 2 is a timing diagram illustrating the operation of the converter of FIG. 1.

FIG. 2 is a timing diagram illustrating the operation of converter 100 of FIG. 1 during a phase of transition from the first configuration (diagonal S1, S3 conductive and diagonal S2, S4 non-conductive) to the second configuration (diagonal S1, S3 non-conductive and diagonal S2, S4 conductive) of primary bridge H1.

More particularly, the timing diagram of FIG. 2 comprises a first curve $V_{CO}$ showing the time variation of voltage $V_{CO}$ across output capacitor CO of primary bridge H1, a second curve $V_{S1}$ showing the time variation of voltage $V_{S1}$ across switch S1, and a third curve $V_{S2}$ showing the time variation of voltage $V_{S2}$ across switch S2.

The example of FIG. 2 considers an initial time t0 at which primary bridge H1 is in the first configuration. Switches S1 and S3 are then on and switches S2 and S4 off, and voltage $V_{CO}$ across capacitor CO is substantially equal to value $V_e$ of the AC input voltage of the converter at the considered time, in the order of 200 volts in the shown example. Given that the converter cut-off frequency is much higher than the AC input voltage of the converter, the AC input voltage is considered as constant during the entire duration of a phase of transition between the first and second configurations of bridge H1. At time t0, voltage $V_{S1}$ across switch S1 is substantially zero (switch S1 on) and voltage $V_{S2}$ across switch S2 is substantially equal to value $V_e$ (switch S2 off).

At a time t1 subsequent to time t0, marking the beginning of a phase of transition between the first and second configurations of primary bridge H1, circuit 101 controls switches S1 and S3 to the off state, while holding switches S2 and S4 in the off state. To ensure the continuity of the current flowing through inductance 12 and/or through the inductance formed by winding W1 of transformer T, capacitor CO then fully discharges, to a zero value, and then negatively charges to value $-V_e$. During the phase of discharge and then of negative charge of capacitor CO, voltage $V_{S1}$ across switch S1 increases to reach value $V_e$ and voltage $V_{S2}$ across switch S2 decreases to a zero value.

Control circuit 101 is configured to detect that voltage $V_{S2}$ across switch S2 has taken a zero value after time t1 of turning off of switches S1 and S3, and to control switch S2 to the on state when it is detected that voltage $V_{S2}$ has taken a zero value.

Thus, at a time t2 subsequent to time t1, corresponding to the time at which the voltage across switch S2 has taken a zero value, circuit 101 controls switch S2 to the on state.

It should be noted that voltages $V_{S3}$ and $V_{S4}$ across switches S3 and S4 have not been shown in FIG. 2, these voltages having substantially the same variation as voltages $V_{S1}$ and $V_{S2}$, respectively.

Time t2 marks the end of the phase of transition between the first and second configurations of primary bridge H1. Switches S2 and S4 are then on and switches S1 and S3 are off, and voltage $V_{CO}$ across capacitor CO is substantially equal to value $-V_e$, in the order of –200 Volts in the shown example. At time t2, voltage $V_{S2}$ across switch S2 is substantially zero and voltage $V_{S1}$ across switch S1 is substantially equal to value $V_e$.

The operation of converter 100 during phases of transition from the second configuration (diagonal S1, S3 off and diagonal S2, S4 on) to the first configuration (diagonal S1, S3 on and diagonal S2, S4 off) of primary bridge H1 is similar to which has just been described, that is, circuit 101 first controls switches S2 and S4 to the off state, while holding switches S1 and S3 in the off state, and then monitors the voltage across switches S1 and S3 to only control switches S1 and S3 to the off state when the voltage thereacross takes a zero value.

Figure 3:
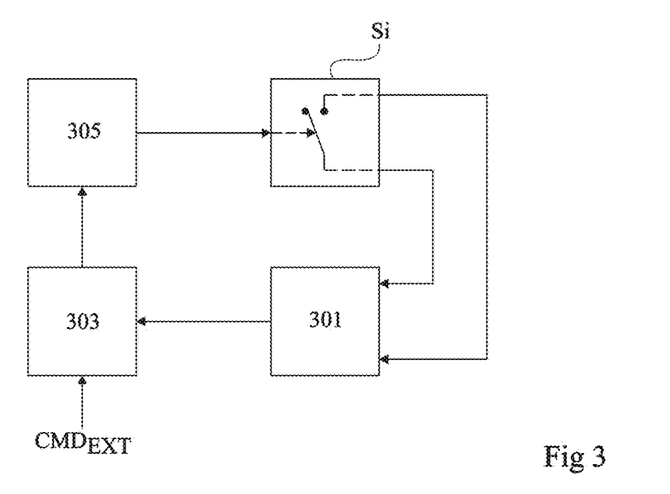
FIG. 3 is a block diagram illustrating an embodiment of a switch control circuit of the converter of FIG. 1.

FIG. 3 schematically and partially illustrates an embodiment of control circuit 101 of converter 100 of FIG. 1. FIG. 3 more particularly illustrates a switch Si of primary bridge H1 of the converter, as well as a control circuit associated with this switch. The control circuit shown in FIG. 3 corresponds to a portion of control circuit 101 of FIG. 1. As an example, each of switches S1, S2, S3, S4 of primary bridge H1 of the converter is associated with a specific control circuit of the type described in relation with FIG. 3.

The control circuit of FIG. 3 comprises, coupled to switch Si by its main conduction nodes, a circuit 301 for detecting the switching to a zero value or to a value considered as zero of the voltage across switch Si. Stage 301 supplies a logic output signal indicating whether the voltage across switch Si is or not considered as zero.

The control circuit of FIG. 3 further comprises a circuit 303 receiving the logic output signal of stage 301, and further receiving an external control signal $CMD_{EXT}$, supplied by a centralized control circuit (not detailed) of circuit 101 of FIG. 1. Circuit 303 carries out a logic operation between the output signal of circuit 301 and external control signal $CMD_{EXT}$, and supplies a logic signal for controlling switch Si, corresponding to the result of this operation. As an example, to switch bridge H1 from the first configuration (diagonal S1, S3 conductive and diagonal S2, S4 non-conductive) to the second configuration (diagonal S1, S3 non-conductive and diagonal S2, S4 conductive), the centralized control circuit of circuit 101 simultaneously sends an order to turn off switch S1, an order to allow the turning on of switch S2, an order to turn off switch S3, and an order to allow the turning on of switch S4, via inputs $CMD_{EXT}$ of circuits 303 associated with switches S1, S2, S3, and S4, respectively. Similarly, to switch bridge H1 from the first configuration (diagonal S1, S3 non-conductive and diagonal S2, S4 conductive) to the second configuration (diagonal S1, S3 non-conductive and diagonal S2, S4 conductive), the centralized control circuit of circuit 101 simultaneously sends an order to turn on switch S1, an order to turn off switch S2, an order to allow the turning on of switch S3, and an order to allow the turning off of switch S4, via inputs $CMD_{EXT}$ of the circuits 303 associated with switches S1, S2, S3, and S4, respectively.

For each switch Si, when the circuit 303 associated with the switch receives an order to turn off the switch, it directly applies a turn-off control signal on its output, without taking into account the output signal of circuit 301.

When the logic circuit 303 associated with a switch Si receives an order to allow the tuning on of switch, it starts by holding on its output a signal for controlling the switch to the off state as long as the output signal of circuit 301 does not indicate that the voltage across the switch has taken a zero value, after which it applies on its output a signal for controlling switch Si to the on state only when the output signal of circuit 301 indicates that the voltage across the switch has taken a zero value.

The control circuit of FIG. 3 further comprises a circuit 305 for adapting the level of the control signal of switch Si, for example, a voltage and/or current amplifier (to be able to charge the gate in the case of a MOS switch), having its input coupled to the output of circuit 303 and having its output coupled to a control node of switch Si. Circuit 305 is capable of transposing the logic control signal supplied by circuit 303 into a signal having a level capable of effectively controlling the switch.

Figure 4:
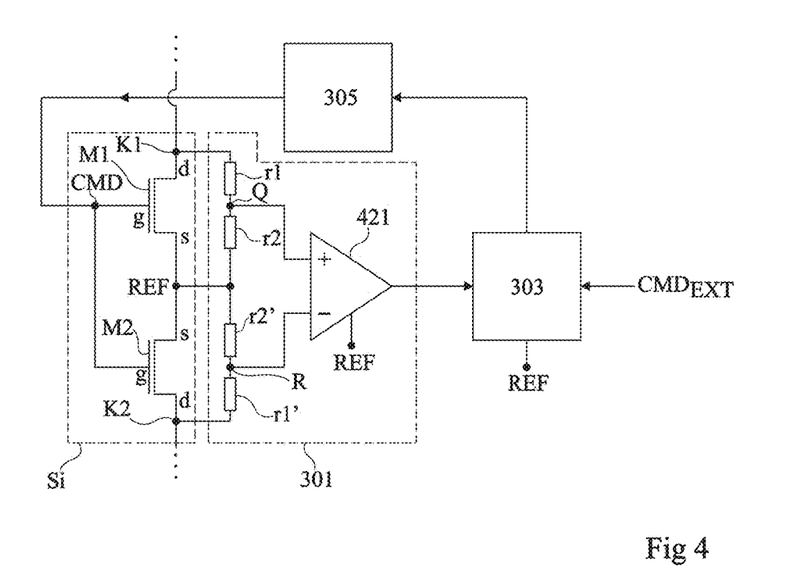
FIG. 4 is a more detailed diagram of an embodiment of a switch of the converter of FIG. 1 and of the circuit for controlling this switch.

FIG. 4 is a more detailed diagram of an embodiment of the circuit of FIG. 3. The circuit of FIG. 4 shows the same elements as the circuit of FIG. 3, and illustrates in further detail an embodiment of switch Si and of circuit 301 for detecting that the voltage across switch Si has taken a zero value.

In this example, a switch Si equivalent to two MOS transistors M1 and M2 connected in anti-series by their sources (s) is considered. The drains (d) of transistors M1 and M2 respectively form the two conduction nodes K1 and K2 of switch Si. The gates (g) of transistors M1 and M2 are connected at a node CMD forming the control node of switch Si. Node REF, common to the sources (s) of transistors M1 and M2, forms a reference node of the switch, having the control signal applied to node CMD referenced thereto.

Circuit 301 comprises a first resistive voltage dividing bridge comprising a resistor r1 in series with a resistor r2, supplying an attenuated image of the drain-source voltage of transistor M1, and a second resistive voltage dividing bridge comprising a resistor r1' in series with a resistor r2', supplying an attenuated image of the drain-source voltage of transistor M2. In this example, resistor r1 has a first end connected to node K1 and a second end connected to a node Q, and resistor r2 has a first end connected to node Q and a second end connected to node REF. Further, in this example, resistor r1' has a first end connected to node K2 and a second end connected to a node R, and resistor r2' has a first end connected to node R and a second end connected to node REF. As an example, resistors r1 and r1' are identical, and resistors r2 and r2' are identical (to within manufacturing dispersions).

Circuit 301 further comprises a voltage comparator 421 referenced to node REF. Output node Q of the first voltage dividing bridge (r1, r2) is coupled to the positive input (+) of comparator 421, and output node R of the second voltage dividing bridge (r1', r2') is coupled to the negative input (−) of comparator 421.

The output of comparator 421 forms the output of circuit 301, coupled to the input of circuit 303 (also referenced to node REF). As previously described in relation with FIG. 3, the output of circuit 303 is coupled to the input of amplification stage 305, the output of amplification stage 305 being coupled to control node CMD of switch Si.

It should be noted that in the example of FIG. 4, the entire chain of control of switch Si, from the detection of the zero crossing of the voltage across the switch to the effective control of the switch, has the same reference potential, that is, the potential of reference node REF of the switch. Thus, the control circuit of FIG. 4 comprises no isolation element, which enables the circuit to be highly responsive. In particular, this enables to control with no significant delay the turning on of switch Si when the voltage thereacross takes a zero value, and thus to maintain switching losses in the switch at a very low level.

It should be noted that in the embodiment of FIG. 1, capacitors C1, C2, C3, C4 enable to slow down voltage variations across switches S1, S2, S3, S4 of primary bridge H1 during switching operations, to ease the detection of the zero crossing of the voltage thereacross. As a variation, these capacitors may be omitted.

Second Embodiment—Inductive Structure

Figure 5:
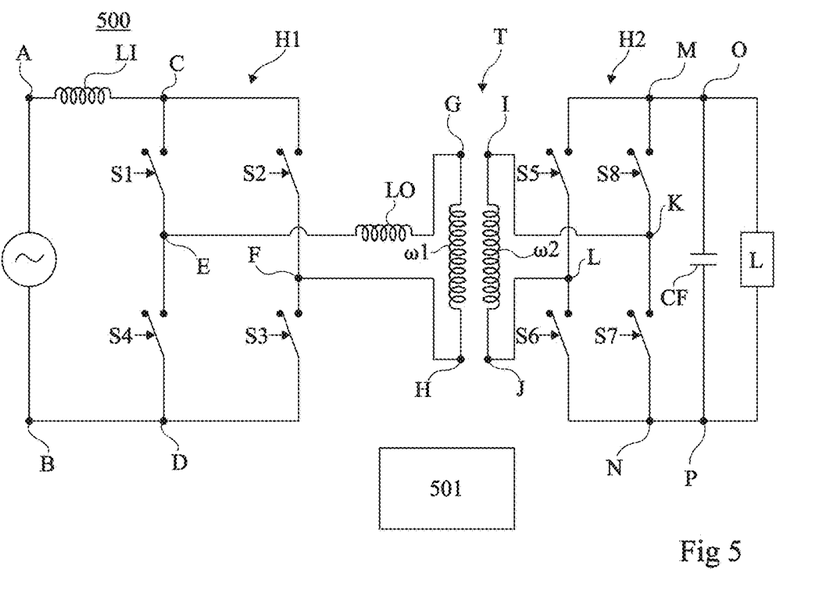
FIG. 5 is a wiring diagram of an example of an AC/DC converter according to a second embodiment.

FIG. 5 is a wiring diagram of an example of an AC/DC converter 500 according to a second embodiment.

Converter 500 comprises a first controlled H bridge H1, or primary bridge, followed by an isolation transformer T, comprising a primary winding W1 and a secondary winding W2, magnetically coupled, followed by a second controlled H bridge H2, or secondary bridge.

Bridge H1 is formed of four switches, bidirectional in terms of current and of voltage, S1, S2, S3, and S4, for example, identical (to within manufacturing dispersions), each comprising two main conduction nodes and at least one control node. Switches S1 and S4 are series-coupled, by their conduction nodes, between input nodes C and D of the bridge. Switches S2 and S3 are series-coupled, by their conduction nodes, between nodes C and D, in parallel with the branch comprising switches S1 and S4. Junction point E of switches S1 and S4 defines a first output node of the bridge, and junction point F of switches S2 and S3 defines a second output node of the bridge. More particularly, in the shown example, switch S1 has a first conduction node connected to node C and a second conduction node connected to node E, switch S4 has a first conduction node connected to node E and a second conduction node connected to node D, switch S2 has a first conduction node connected to node C and a second conduction node connected to node F, and switch S3 has a first conduction node connected to node F and a second conduction node connected to node D.

Input nodes C and D of bridge H1 are directly coupled, that is, with no intermediate rectifying stage comprising diodes and no low-pass filtering stage, to nodes A and B of application of the AC input voltage of the converter.

Output nodes E and F of bridge H1 are coupled to ends G and H of primary winding W1 of transformer T.

According to an aspect of the second embodiment, primary bridge H1 is purely inductive at its input and at its output. More particularly, converter 500 comprises an inductance LI series-connected with the bridge, via input nodes C and D of the bridge, between nodes A and B of application of the AC input voltage of the converter, and an inductance LO series-connected with the bridge, via output nodes E and F of the bridge, between ends G and H of primary winding W1 of transformer T. In the shown example, inductance LI has a first end connected to node C and a second end connected to node A, and node D is connected to node B. Further, in this example, inductance LO has a first end connected to node E and a second end connected to node G, and node F is connected to node H. In the embodiment of FIG. 5, the converter comprises no capacitive element connected at the input of bridge H1, between nodes C and D, and comprises no capacitive element connected at the output of bridge H1, between nodes, E and F, either. It should be noted that here again, such a layout is unusual. Indeed, in power electronics, passive electric power exchange elements of different natures are generally provided at the input and at the output of a same H bridge, to respect source association rules.

Bridge H2 is formed of four controlled switches S5, S6, S7, and S8, for example, identical (to within manufacturing dispersions), each comprising two main conduction nodes and at least one control node. Switches S5, S6, S7, and S8 are for example nearly bidirectional switches, that is, switches capable of conducting current in both directions, but only enabling to control the current in one direction (in other words, switches which are bidirectional in terms of current but unidirectional in terms of voltage). As a variation, switches S5, S6, S7, S8 are bidirectional in terms of current and of voltage. Switches S5 and S8 are series-coupled, by their conduction nodes, between input nodes K and L of the bridge. Switches S6 and S7 are series-coupled, by their conduction nodes, between nodes K and L, in parallel with the branch comprising switches S5 and S8. Junction point M of switches S5 and S8 defines a first output node of the bridge, and junction point N of switches S6 and S7 defines a second output node of the bridge. More particularly, in the shown example, switch S5 has a first conduction node connected to node L and a second conduction node connected to node M, switch S8 has a first conduction node connected to node M and a second conduction node connected to node K, switch S6 has a first conduction node connected to node L and a second conduction node connected to node N, and switch S7 has a first conduction node connected to node N and a second conduction node connected to node K.

Input nodes K and L of bridge H2 are respectively coupled to ends I and J of secondary winding W2 of transformer T. In the shown example, end I of winding W2 is connected to node K and end J of winding W2 is connected to node L.

Converter 500 further comprises an output filtering capacitor CF, at the output of bridge H2. In the shown example, the electrodes of capacitor CF are respectively connected to output nodes M and N of bridge H2.

Output nodes M and N of bridge H2 are respectively coupled to nodes O and P supplying the DC output voltage of converter 500. In the shown example, node M is connected to node O and node N is connected to node P.

Converter 500 further comprises a circuit 501 (not detailed) for controlling switches S1, S2, S3, S4, S5, S6, S7 and S8 of bridges H1 and H2.

In operation, a load L to be powered, for example, an electric battery, may be connected between output nodes O and P of the converter.

Converter 500 operates as follows: Circuit 501 controls primary bridge H1 alternately to a first configuration where switches S1 and S3, defining a first diagonal of the bridge, are on and switches S2 and S4, defining a second diagonal of the bridge, are off, and to a second configuration where switches S1 and S3 are off and switches S2 and S4 are on. As in the first embodiment, the frequency of the switching of bridge H1 between the first and second configurations, or cut-off frequency, is preferably selected to be much higher than the frequency of the AC voltage to be converted, for example, in the range from 200 kHz to 20 MHz for an input frequency in the range from 20 to 100 Hz. Duty cycle ϕH1 of the switching between the first and second configurations of bridge H1 is for example approximately equal to 0.5.

Circuit 501 further controls secondary bridge H2 alternately to a first configuration where switches S5 and S7, defining a first diagonal of the bridge, are on and switches S6 and S8, defining a second diagonal of the bridge, are off, and to a second configuration where switches S5 and S7 are off and switches S6 and S8 are on. The frequency of the switching of bridge H2 between the first and second configurations is substantially equal to the switching frequency of bridge H1. Duty cycle ϕH2 of the switching between the first and second configurations of bridge H2 may however be different from duty cycle ϕH1 of the primary bridge. Further, a phase shift δH1H2 may be provided between the control sequence of primary bridge H1 and the control sequence of secondary bridge H2.

As in the first embodiment, by varying parameters ϕH2 and δH1H2, circuit 501 regulates the DC output voltage of converter 500, and/or the current sampled from the converter AC power supply voltage source, for example, to ensure a sinusoidal absorption of the current supplied by the AC source.

Further, as in the first embodiment, the converter of FIG. 5 is reversible. Thus, in the case where an active load L, for example, a battery, is connected to the converter output, circuit 501 may, by varying the above-mentioned parameters ϕH1, ϕH2 and/or δH1H2, control a DC/AC electric power transfer from DC load L to the AC input of the converter.

According to an aspect of the second embodiment, control circuit 501 is configured to, during phases of transition between the first configuration (diagonal S1, S3 conductive and diagonal S2, S4 non-conductive) and the second configuration (diagonal S1, S3 non-conductive and diagonal S2, S4 conductive) of primary bridge H1, only turn off switches S1 and S3 when the current flowing therethrough takes a zero value and, during phases of transition between the second configuration (diagonal S1, S3 non-conductive and diagonal S2, S4 conductive) and the first configuration (diagonal S1, S3 conductive and diagonal S2, S4 non-conductive) of bridge H1, only turn off switches S2 and S4 when the current flowing therethrough takes a zero value.

This enables to significantly limit switching losses in primary bridge H1. The cut-off frequency of the converter may then be selected to be relatively high, for example, greater than 1 MHz or even greater than 10 MHz, which enables to significantly decrease the dimensions of isolation transformer T.

In a preferred embodiment, switches S1, S2, S3, S4 of the primary bridge H1 and switches S5, S6, S7, S8 of secondary bridge H2 are gallium nitride switches. The described embodiments are however not limited to this specific example.

Figure 6:
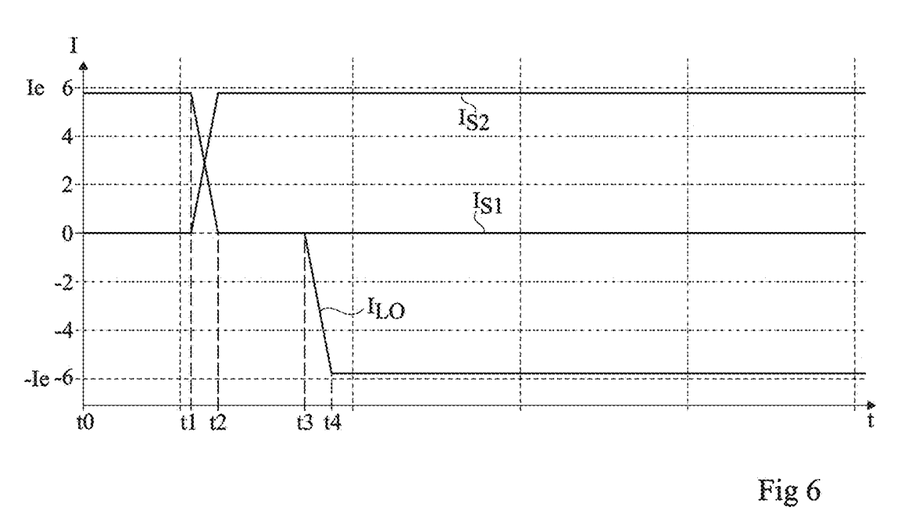
FIG. 6 is a timing diagram illustrating the operation of the converter of FIG. 5.

FIG. 6 is a timing diagram illustrating the operation of converter 500 of FIG. 5 during a phase of transition from the first configuration (diagonal S1, S3 conductive and diagonal S2, S4 non-conductive) to the second configuration (diagonal S1, S3 non-conductive and diagonal S2, S4 conductive) of primary bridge H1.

More particularly, the timing diagram of FIG. 6 comprises a first curve $I_{LO}$ showing the time variation of current $I_{LO}$ flowing through output inductance LO of primary bridge H1, a second curve $I_{S1}$ showing the time variation of current $I_{S1}$ flowing through switch S1, and a third curve $I_{S2}$ showing the time variation of current $I_{S2}$ flowing through switch S2.

The example of FIG. 6 considers an initial time t0 at which primary bridge H1 is in the first configuration. Switches S1 and S3 are then on and switches S2 and S4 are off, and current $I_{LO}$ flowing through inductance LO is substantially equal to the current $I_e$ flowing through input inductance LI of bridge H1 at the considered time. Given that the converter cut-off frequency is much higher than the AC input voltage of the converter, the AC input current $I_e$ is considered as constant during the entire duration of a phase of transition between the first and second configurations of bridge H1. At time t0, current $I_{S1}$ in switch S1 is substantially equal to input current $I_e$ (switch S1 on), and current $I_{S2}$ in switch S2 has a substantially zero value (switch S2 off). Further, current $I_{S3}$ (not shown) in switch S3 is substantially equal to input current $I_e$, and current $I_{S4}$ (not shown) in switch S4 has a substantially zero value.

At a time t1 subsequent to time t0, marking the beginning of a phase of transition between the first and second configurations of primary bridge H1, circuit 501 controls switch S2 to the on state, while holding switches S1 and S3 in the on state and switch S4 in the off state. Inductance LO then discharges until the current flowing through primary winding W1 of the transformer, and thus current $I_{S1}$ flowing through switch S1, takes a zero value. At the same time, current $I_{S2}$ increases to reach value $I_e$.

Switch S1 is configured to automatically turn off when the current flowing therethrough takes a zero value. At a time t2 subsequent to time t1, switch S1 turns off.

At a time t3 subsequent to time t2, circuit 501 controls switch S4 to the on state, while holding switches S2 and S3 in the on state and switch S1 in the off state. Inductance LO then negatively charges until the current flowing therethrough reaches value $-I_e$. At the same time, current $I_{S4}$ flowing through switch S4 increase to reach value $I_e$, and current $I_{S3}$ flowing through S3 decreases until it takes a zero value.

Switch S3 is configured to automatically turn off when the current flowing therethrough takes a zero value. Thus, at a time t4 subsequent to time t3, switch S3 turns off.

Time t4 marks the end of the phase of transition between the first and second configurations of primary bridge H1. Switches S2 and S4 are then conductive and switches S1 and S3 are non-conductive.

The operation of converter 500 during phases of transition from the second configuration (diagonal S1, S3 non-conductive and diagonal S2, S4 conductive) to the first configuration (diagonal S1, S3 conductive and diagonal S2, S4 non-conductive) of primary bridge H1 is similar to what has just been described, that is, circuit 501 first controls switch S1 to the on state while holding switches S2 and S4 in the off state and switch S3 in the off state and then, after the automatic turning off of switch S2, it controls switch S3 to the on state while holding switches S1 and S4 in the on state and switch S2 in the off state, until the automatic turning off of switch S4.

Thus, in the example of operation described in relation with FIG. 6, each of switches Si of primary bridge H1 should be controllable to the on state by control circuit 501 and should be capable, after having turned on, of automatically turning back off when the current flowing therethrough takes a zero value.

Figure 7A:
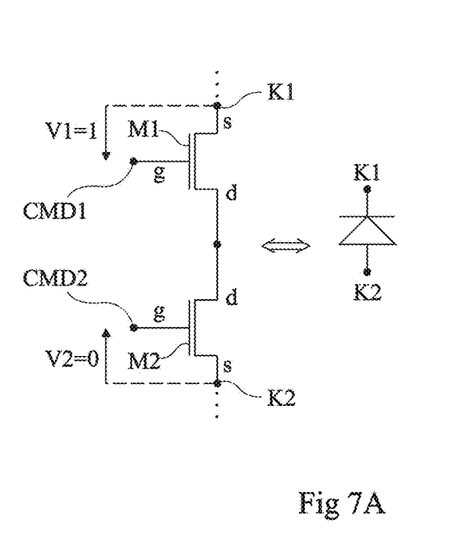
FIGS. 7A and 7B illustrate an embodiment of a switch of the converter of FIG. 5.
Figure 7B:
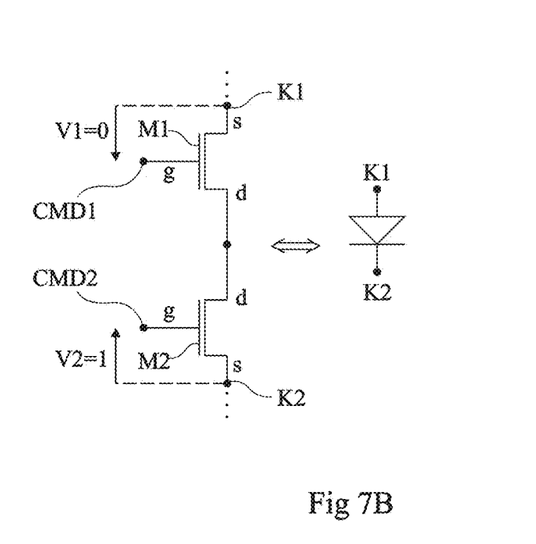

FIGS. 7A and 7B schematically illustrate an embodiment of a switch Si of primary bridge H1 adapted to the operating mode described in relation with FIG. 6.

In this example, a switch Si equivalent to two MOS transistors M1 and M2 connected in anti-series by their drains (d) is considered. The sources (s) of transistors M1 and M2 respectively form the two conduction nodes K1 and K2 of switch Si. The gate (g) of transistor M1 is connected to a node CMD1 forming a first control node of switch Si. The gate (g) of transistor M2 is connected to a node CMD2 forming a second control node of switch Si.

Control circuit 501 of converter 500 is configured to, when it controls a switch Si of primary bridge H1 to the on state, start the switch so that it behaves as a diode, and thus that it can naturally turn off when the current between its conduction nodes K1 and K2 takes a zero value. To achieve this, on turning on of switch Si, circuit 501 applies a turn-on control signal to the gate of one of the two transistors M1 and M2 and maintains a turn-off signal on the gate of the other transistor.

More particularly, in the shown example, in the case where a negative current should flow between conduction nodes K1 and K2 of the switch, a positive gate-source voltage is applied to transistor M1 (voltage V1 between node CMD1 and node K1), and a zero or negative gate-source voltage is applied to transistor M2 (voltage V2 between node CMD2 and node K2). In this case, switch Si behaves as a diode having its anode connected to node K2 and its cathode connected to node K1. Such a configuration is illustrated in FIG. 7A.

In the case where a positive current should flow between conduction nodes K1 and K2 of the switch, a negative or zero gate-source voltage is applied to transistor M1 (voltage V1 between node CMD1 and node K1), and a positive gate-source voltage is applied to transistor M2 (voltage V2 between node CMD2 and node K2). In this case, switch Si behaves as a diode having its anode connected to node K1 and its cathode connected to node K2. Such a configuration is illustrated in FIG. 7B.

Specific embodiments have been described. Various alterations, modifications, and improvements will occur to those skilled in the art. In particular, the described embodiments are not limited to the examples of numerical values mentioned as an example in the present description.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An AC-voltage-to-DC-voltage conversion circuit, comprising:
   first, second, third and fourth switches being current and voltage bidirectional and forming a first bridge having first and second input nodes and first and second output nodes, the first and fourth switches being series-coupled between the first and second input nodes of the first bridge and forming a first branch of the first bridge, the second and third switches being series-coupled between the first and second input nodes of the first bridge in parallel to the first branch of the first bridge and forming a second branch of the first bridge, and the first and second output nodes of the first bridge being respectively coupled to an intermediate node of the first branch of the first bridge, between the first and fourth switches, and to an intermediate node of the second branch of the first bridge, between the second and third switches, the first and second input nodes of the first bridge being respectively directly coupled to first and second nodes of application of an AC voltage;
   a first capacitor connected in parallel with the first bridge between the first and second input nodes of the first bridge; and
   a control circuit configured to control the bridge alternately to a first configuration where the first and third switches are on and the second and fourth switches are off and to a second configuration where the first and third switches are off and the second and fourth switches are on,
   the control circuit being configured to, during a phase of transition between the first and second configurations, successively:
   turn off the first and third switches; and
   for each of the second and fourth switches, monitor a voltage across the switch and turn on the switch only when the voltage thereacross takes a zero value.

2. The AC-voltage-to-DC-voltage conversion circuit of claim 1, further comprising a second capacitor connected in parallel with the first bridge between the first and second output nodes of the first bridge.

3. The AC-voltage-to-DC-voltage conversion circuit of claim 1, further comprising first, second, third and fourth additional capacitors respectively connected across the first, second, third and fourth switches.

4. The AC-voltage-to-DC-voltage conversion circuit of claim 1, further comprising a transformer comprising a primary winding and a secondary winding, magnetically coupled, first and second ends of the primary winding being respectively coupled to the first and second output nodes of the first bridge.

5. The AC-voltage-to-DC-voltage conversion circuit of claim 4, further comprising fifth, sixth, seventh and eighth switches forming a second bridge having first and second input nodes and first and second output nodes, the fifth and eighth switches being series-coupled between the first and second input nodes of the second bridge and forming a first branch of the second bridge, the sixth and seventh switches being series-coupled between the first and second input nodes of the second bridge in parallel to the first branch of the second bridge and forming a second branch of the second bridge, and the first and second output nodes of the second bridge being respectively coupled to an intermediate node of the first branch of the second bridge, between the fifth and eighth switches, and to an intermediate node of the second branch of the second bridge, between the sixth and seventh switches, the first and second input nodes of the second bridge being respectively coupled to first and second ends of the secondary winding of the transformer, and the first and second output nodes of the second bridge being respectively coupled to first and second DC voltage supply nodes.

6. The AC-voltage-to-DC-voltage conversion circuit of claim 5, wherein the control circuit is configured to control the second bridge alternately to a first configuration where the fifth and seventh switches are on and the sixth and eighth switches are off, and to a second configuration where the fifth and seventh switches are off and the sixth and eighth switches are on.

7. The AC-voltage-to-DC-voltage conversion circuit of claim 6, wherein the control circuit is configured to switch the first bridge between its first and second configurations and to switch the second bridge between its first and second configurations substantially at the same frequency.

8. The AC-voltage-to-DC-voltage conversion circuit of claim 1, wherein the control circuit is configured to switch the first bridge between its first and second configurations at a frequency greater than or equal to 1 MHz.

9. The AC-voltage-to-DC-voltage conversion circuit of claim 1, wherein the control circuit comprises, for each of the first, second, third and fourth switches:
   a first circuit configured to detect that a voltage across the switch has taken a zero value and to supply a first logic signal corresponding to a result of this detection;
   a second circuit configured to perform a logic operation between the first logic signal and a second logic signal applied to a control terminal of the second circuit, and to supply a third logic signal corresponding to a result of this operation; and
   a third circuit configured to convert the third logic signal into a control signal applied to the switch.

10. The AC-voltage-to-DC-voltage conversion circuit of claim 9, wherein each of the first, second, third and fourth switches is equivalent to an anti-series association of first and second MOS transistors having a common source node, a drain node of the first MOS transistor forming a first conduction node of the switch, a drain node of the second MOS transistor forming a second conduction node of the switch, a gate of the first MOS transistor and a gate of the second MOS transistor being connected to a same control node of the switch.

11. The AC-voltage-to-DC-voltage conversion circuit of claim 10, wherein, for each of the first, second, third and fourth switches, the first circuit comprises a voltage comparator, a first voltage dividing bridge coupled between the drain node and the source node of the first MOS transistor and having an output node coupled to a positive input node of the voltage comparator, and a second voltage dividing bridge coupled between the drain node and the source node of the second MOS transistor and having an output node coupled to a negative input node of the voltage comparator.

12. The AC-voltage-to-DC-voltage conversion circuit of claim 1, wherein the first, second, third and fourth switches are gallium nitride switches.

13. The AC-voltage-to-DC-voltage conversion circuit of claim 1, wherein the control circuit is further configured to, during a phase of transition between the second and first configurations, successively:
   turn off the second and fourth switches; and
   for each of the first and third switches, monitor a voltage across the switch and turn on the switch only when the voltage thereacross takes a zero value.

14. An AC-voltage-to-DC-voltage conversion circuit, comprising:
   a first H bridge, comprising:
      a first set of switches comprising four bidirectional switches forming the first H bridge; and
      first and second input nodes; and
      first and second output nodes;
   first and second AC voltage application nodes respectively directly coupled to the first and second input nodes;
   a first capacitor connected in parallel with the first H bridge between the first and second input nodes; and
   a control circuit configured to control the bridge alternately to first and second configurations;
      wherein the first configuration comprises a first diagonal of the first set of switches being on and a second diagonal of the first set of switches being off;
      wherein the second configuration comprises the first diagonal of the first set of switches being off and the second diagonal of the first set of switches being on; and
   wherein the control circuit is further configured to, during a phase of transition between the first and second configurations, successively:
      turn off a first switch of the first diagonal;
      turn off a second switch of the first diagonal;
      turn on a first switch of the second diagonal; and
      turn on a second switch of the second diagonal.

15. The AC-voltage-to-DC-voltage conversion circuit of claim 14, wherein the control circuit is further configured to, successively:
   monitor a first voltage across the first switch of the second diagonal;
   turn on the first switch of the second diagonal only when the first voltage takes a zero value;
   monitor a second voltage across the second switch of the second diagonal; and
   turn on the second switch of the second diagonal only when the second voltage takes a zero value.

16. The AC-voltage-to-DC-voltage conversion circuit of claim 15, wherein the control circuit is further configured to, successively:
   detect when the first voltage across the first switch of the second diagonal takes a zero value;
   turn on the first switch of the second diagonal only when the control circuit detects that the first voltage takes a zero value;
   detect when the second voltage across the second switch of the second diagonal takes a zero value; and
   turn on the second switch of the second diagonal only when the control circuit detects that the second voltage takes a zero value.

17. The AC-voltage-to-DC-voltage conversion circuit of claim 16, wherein the control circuit is further configured to, during a phase of transition between the second and first configurations, successively:
   turn off a first switch of the second diagonal;
   turn off a second switch of the second diagonal;
   detect when a first voltage across a first switch of the first diagonal takes a zero value;
   turn on the first switch of the first diagonal only when the control circuit detects that the first voltage takes a zero value;
   detect when a second voltage across a second switch of the first diagonal takes a zero value; and
   turn on the second switch of the first diagonal only when the control circuit detects that the second voltage takes a zero value.

18. The AC-voltage-to-DC-voltage conversion circuit of claim 17, further comprising:
   a transformer, comprising:
      a primary winding comprising a first end and a second end;
      a secondary winding comprising a first end and a second end;
      wherein the secondary winding is magnetically coupled to the primary winding; and wherein the first and second ends of the primary winding are respectively coupled to the first and second output nodes of the first H bridge; and a second H bridge, comprising:
a second set of switches comprising four bidirectional switches forming the second H bridge;
first and second input nodes respectively coupled to the first and second ends of the secondary winding of the transformer;
first and second output nodes; and
first and second DC voltage supply nodes respectively coupled to the first and second output nodes;
wherein the control circuit is configured to control the second H bridge alternately to first and second configurations;
wherein the first configuration comprises a first diagonal of the second set of switches being on and a second diagonal of the second set of switches being off;
wherein the second configuration comprises the first diagonal of the second set of switches being off and the second diagonal of the second set of switches being on.

19. The AC-voltage-to-DC-voltage conversion circuit of claim 14, wherein the control circuit comprises, for each switch of the first set of switches:
a first circuit configured to detect that a voltage across the switch has taken a zero value and to supply a first logic signal corresponding to whether the first circuit detects that the voltage has taken a zero value;
a second circuit comprising a control terminal, wherein the second circuit is configured to:
receive a second logic signal applied to the control terminal;
perform a logic operation between the first logic signal and the second logic signal; and
supply a third logic signal corresponding to a result of the logic operation; and a third circuit configured to:
receive the third logic signal;
convert the third logic signal into a control signal; and
apply the third logic signal to the switch.

20. The AC-voltage-to-DC-voltage conversion circuit of claim 19, wherein:
each switch of the first set of switches is equivalent to an anti-series association of first and second MOS transistors, wherein:
the first and second MOS transistors each comprise a gate, a source and a drain;
the source of the first MOS transistor is connected to the source of the second MOS transistor;
the drain of the first MOS transistor forms a first conduction node of the switch;
the drain of the second MOS transistor forms a second conduction node of the switch;
the gate of the first MOS transistor and the gate of the second MOS transistor are connected to a same control node of the switch; and for each switch of the first set of switches, the first circuit comprises:
a voltage comparator comprising a positive input node and a negative input node;
a first voltage dividing bridge coupled between the drain and the source of the first MOS transistor, the first voltage dividing bridge having an output node coupled to the positive input node of the voltage comparator; and
a second voltage dividing bridge coupled between the drain and the source of the second MOS transistor, the second voltage dividing bridge having an output node coupled to a negative input node of the voltage comparator.

* * * * *

UNITED STATES PATENT AND TRADEMARK OFFICE
CERTIFICATE OF CORRECTION

PATENT NO. : 10,250,158 B2
APPLICATION NO. : 15/866392
DATED : April 2, 2019
INVENTOR(S) : Léo Sterna et al.

Page 1 of 1

It is certified that error appears in the above-identified patent and that said Letters Patent is hereby corrected as shown below:

On the Title Page

At item (73) Assignee: "Commisariat à l'Énergie Atomique et aux Énergies Alternatives, Paris (FR)" should read --Commissariat à l'Énergie Atomique et aux Énergies Alternatives, Paris (FR)--.

Signed and Sealed this
Eighteenth Day of June, 2019

Andrei Iancu
*Director of the United States Patent and Trademark Office*